(12) United States Patent
Kartoun et al.

(10) Patent No.: US 11,023,785 B2
(45) Date of Patent: Jun. 1, 2021

(54) SPARSE MRI DATA COLLECTION AND CLASSIFICATION USING MACHINE LEARNING

(71) Applicant: International Business Machines Corporation, Armonk, NY (US)

(72) Inventors: Uri Kartoun, Cambridge, MA (US); Fang Lu, Billerica, MA (US); Meenal Pore, Nairobi (KE)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 16/042,441

(22) Filed: Jul. 23, 2018

(65) Prior Publication Data

US 2020/0026967 A1     Jan. 23, 2020

(51) Int. Cl.
*G06K 9/62*     (2006.01)
*G06N 3/08*     (2006.01)
(Continued)

(52) U.S. Cl.
CPC ....... *G06K 9/6268* (2013.01); *G01R 33/4818* (2013.01); *G06K 9/6249* (2013.01); *G06K 9/6262* (2013.01); *G06K 9/6284* (2013.01); *G06N 3/08* (2013.01); *G06T 11/003* (2013.01); *G06K 2209/05* (2013.01); *G06T 2207/10088* (2013.01)

(58) Field of Classification Search
CPC ........ G06T 11/003; G06T 2207/10088; G06N 3/0427; G06N 3/08; G06K 9/6244; G06K 9/6249; G06K 9/6262; G06K 9/6268; G06K 9/6284; G06K 2209/05; G01R 33/4818
See application file for complete search history.

(56) References Cited

U.S. PATENT DOCUMENTS 8,717,024 B2    5/2014    King et al.
9,668,699 B2 *   6/2017    Georgescu ........... A61B 5/7267
(Continued)

FOREIGN PATENT DOCUMENTS

| CN | 106096616 A | 11/2016 |
|----|----|----|
| CN | 106096632 A | 11/2016 |
| WO | 2017223560 A1 | 12/2017 |

OTHER PUBLICATIONS

Ghesu et al. "Efficient medical image parsing." Deep Learning for Medical Image Analysis. Academic Press, Jan. 2017. 55-81. (Year: 2017).*

(Continued)

*Primary Examiner* — Katrina R Fujita
(74) *Attorney, Agent, or Firm* — Grant M. McNeilly

(57) ABSTRACT

A system, method and program product for implementing a sparse sampling strategy for acquiring MRI data. A method includes: collecting and labeling a training dataset of MRI scans for a predetermined diagnostic; selecting a sampling shape and associated parameter values; sampling each MRI scan in the training data set using the sampling shape and associated parameter values to generate a set of sparse samples; training a neural network using the sparse samples and assigning an accuracy to a resulting trained neural network; and adjusting the associated parameter values, and repeating the sampling and training until optimized parameter values are established.

17 Claims, 5 Drawing Sheets

(51) Int. Cl.
    *G06T 11/00*    (2006.01)
    *G01R 33/48*    (2006.01)

(56)                References Cited

U.S. PATENT DOCUMENTS

| | | | |
|---|---|---|---|
| 9,692,619 | B2 | 6/2017 | Abdoli et al. |
| 10,107,884 | B2 * | 10/2018 | Boernert ........... G01R 33/34092 |
| 10,145,924 | B2 | 12/2018 | Traechtler et al. |
| 2009/0326367 | A1 * | 12/2009 | Doyle .............. G01R 33/56333 600/413 |
| 2012/0249353 | A1 | 10/2012 | Khajehnejad et al. |
| 2015/0112182 | A1 * | 4/2015 | Sharma ..................... G06T 7/20 600/408 |
| 2016/0292856 | A1 | 10/2016 | Niemeijer et al. |
| 2017/0103512 | A1 | 4/2017 | Mailhe et al. |
| 2017/0109881 | A1 | 4/2017 | Avendi et al. |
| 2018/0035892 | A1 | 2/2018 | Lu et al. |
| 2019/0172230 | A1 * | 6/2019 | Mailhe ..................... G06N 3/08 |

OTHER PUBLICATIONS

Baker, Christopher. "Comparison of MRI under-sampling techniques for compressed sensing with translation invariant wavelets using Fasttestcs: A flexible simulation tool." Journal of Signal and Information Processing 7.04 (2016): 252. (Year: 2016).*

Jurrissen et al. "Diamond-SENSE: undersampling on a crystallographic grid." Proceedings of the 12th Annual Meeting of ISMRM, Kyoto, Japan. 2004. (Year: 2004).*

Ji, Jim X. "Compressive sensing imaging with randomized lattice sampling: Applications to fast 3D MRI." 2011 Annual International Conference of the IEEE Engineering in Medicine and Biology Society. IEEE, 2011. (Year: 2011).*

Suzuki, K.; "Overview of deep learning in medical imaging"; SpringerLink; Sep. 2017; vol. 10; Issue 3; pp. 29; Copyright 2017 Springer Nature Switzerland AG; Printed Jul. 23, 2018; <https://link.springer.com/article/10.1007%2Fs12194-017-0406-5>.

Lle, June-Goo et al.; "Deep Learning in Medical Imaging: General Overview"; Korean Journal of Radiology; Jul.-Aug. 2017; 18(4); Published online May 19, 2017; pp. 21; Printed Jul. 23, 2018; Copyright 2017 The Korean Society of Radiology; <https://www.ncbi.nlm.nih.gov/pmc/articles/PMC5447633/>.

Litjens, Geert et al.; "A Survey on Deep Learning in Medical Image Analysis"; Computer Science>Computer Vision and Pattern Recognition; pp. 2; Date Unknown; Printed Jul. 23, 2018; <https://arxiv.org/abs/1702.05747>.

Riaz, Asad A. et al.; "FCNet: A Convolutional Neural Network for Calculating Functional Connectivity from functional MRI"; City Research Online; pp. 2; Date Unknown; <http://openaccess.city.ac.uk/18045/>.

Lecun, Yann; "Computer Perception With Deep Learning"; Center for Data Science & Courant Institute of Mathematical Sciences New York University; pp. 213; Date Unknown; <http://yann.lecun.com>.

Ganguli, Surya et al.; "Compressed Sensing, Sparsity, and Dimensionality in Neuronal Information Processing and Data Analysis"; Annu. Rev. Neurosci 2012; Copyright 2012 by Annual Reviews; pp. 26; <www.annualreviews.org>.

McCann, Michael T. et al.; A Review of Convolutional Neural Networks for Inverse Problems in Imaging; Date Unknown; pp. 11.

Lustig, Michael et al.; "Compressed Sensing MRI"; Date Unknown; pp. 18.

Jin, Kyong Hwan et al.; "Deep Convolutional Neural Network for Inverse Problems in Imaging"; IEEE Transactions on Image Processing; vol. 26; No. 9; Sep. 2015; pp. 4509-4522.

Tiwari, Vibha et al.; "Designing sparse sensing matrix for compressive sensing to reconstruct high resolution medical images"; Biomedical Engineering—Research Article; cogent engineering; 2015; pp. 13; <http://dx.doLorg/10.1080/23311916.2015.1017244>.

Davies, Mike et al.; "A Compressed Sensing Framework for Magnetic Resonance Fingerprinting"; Date Unknown; pp. 32.

Lee, Jin Hyung et al.; "Optimal Variable-Density K-Space Sampling in MRI"; Department of Electrical Engineering, Stanford University; Copyright IEEE 2014; pp. 237-240.

Razzak, Muhammad Imran et al.; "Deep Learning for Medical Image Processing: Overview, Challenges and Future"; Date Unknown; pp. 30.

* cited by examiner

SPARSE MRI DATA COLLECTION AND CLASSIFICATION USING MACHINE LEARNING

TECHNICAL FIELD

The subject matter of this invention relates to collecting and classifying magnetic resonance image (MRI) data and more particularly to a system and method of obtaining MRI data using a sparse sensing strategy determined from machine learning.

BACKGROUND

Magnetic Resonance Imaging (MRI) provides one of the most sensitive and useful imaging modalities for clinical imaging. However, MRI use is often limited by cost and consideration for patient comfort in that MRI acquisitions generally take a long time. As a result, reducing acquisition time has been an active research area within the MRI research community. One of the methods that has been explored is applying compressed (i.e., "sparse") sensing to MRI acquisition, which accelerates the process by acquiring less data.

MRI data is not acquired directly in the image space, but in k-space which contains information on spatial frequencies contained in the image. The image space and k-space are related by Fourier transformation. By the Nyquist criterion, the sampling of the image in k-space should encode twice the highest spatial frequency of interest in the image space. As a result, traditional MRI requires high resolution images to be acquired so that all the relevant spatial frequencies can be reconstructed once the image is Fourier transformed into the image space.

Several techniques have been developed to either reduce the acquisition time of a full resolution image (e.g. parallel imaging) or to allow assumptions to be made based on the symmetry of k-space (partial Fourier sampling). However, these methods quickly reach limitations on acquisition time. More recently, compressed sensing approaches have been developed, that under-sample images and do not comply with the Nyquist criterion. Compressed sensed k-space acquisitions must be reconstructed using a sparse transform, such as a wavelet or discrete cosine transform, for example. In addition, prior knowledge of the image can be utilized to improve reconstruction of the image using Bayesian models. However, noise and artifacts in reconstructed images increase with increasing sparsity, and as a result compressed sensing of MRI will also reach a limit if images are to be reconstructed.

Another challenge in the use of diagnostic images is that highly skilled clinicians are required to interpret the images. Machine learning models, and more recently deep learning models, have been developed to classify images. Deep learning in particular has been very effective in classifying images, and does not rely on prior knowledge of features in the image, as traditional computer vision models did. In the past few years there has been a proliferation in research using deep learning to classify medical images and several review articles have been published on current research in this area. Challenges with machine learning include the fact that using full reconstructed images in deep learning models requires a large number of parameters to be trained. As a result very large datasets are needed to prevent overfitting of the model.

SUMMARY

The present approach enhances MRI data acquisition by using machine and deep learning models to optimize sparse sensing. This approach reduces the number of parameters that must be trained, and hence reduces the volume of training data required.

In existing MRI practice, images are reconstructed to allow human interpretation, which requires anatomical features to be identified, and hence requires a large range of frequencies to be sampled for MRI. However, much of the key information is related to specific spatial frequencies within the image. For example, osteoporosis (reduce bone density) is often diagnosed and measured using MRI scans. The scans are used to detect changes in the size of pores in the bone, and hence they are used to detect increasing pore size, which is indicative of reducing bone density (and hence increased risk of fractures). While fully reconstructed images allow such changes to be interpreted by clinicians, the present approach allows such information to be encoded through sampling a small section of k-space (i.e., compressed sensing) that contains information substantially limited to the relevant spatial frequencies. Namely, machine learning and/or deep learning models are utilized to classify raw MRI signals for compressed sensing acquisition to significantly reduce the image acquisition time (and hence cost).

A first aspect discloses a method for implementing a sparse sampling strategy for acquiring MRI data, comprising: collecting and labeling a training dataset of MRI scans for a predetermined diagnostic; selecting a sampling shape and associated parameter values; sampling each MRI scan in the training data set using the sampling shape and associated parameter values to generate a set of sparse samples; training a neural network using the sparse samples and assigning an accuracy to a resulting trained neural network; and adjusting the associated parameter values, and repeating the sampling and training until optimized parameter values are established.

A second aspect discloses a system for implementing a sparse sampling strategy for acquiring MRI data, comprising: a system for collecting and labeling a training dataset of MRI scans for a predetermined diagnostic; a system for selecting a sampling shape and associated parameter values; a sampling system for sampling each MRI scan in the training data set using the sampling shape and associated parameter values to generate a set of sparse samples; a training system for training a neural network using the sparse samples and assigning an accuracy to the neural network; and a parameter optimization system that adjusts the associated parameter values and repeatedly runs the sampling system and training system until optimized parameter values are established.

A third aspect discloses a computer program product stored on a computer readable storage medium, which when executed by a computing system, provides a sparse sampling strategy for acquiring MRI data, the program product comprising: program code that collects labels a training dataset of MRI scans for a predetermined diagnostic; program code for selecting a sampling shape and associated parameter values; program code for sampling each MRI scan in the training data set using the sampling shape and associated parameter values to generate a set of sparse samples; program code for training a neural network using the sparse samples and assigning an accuracy to a resulting trained neural network; and program code for adjusting the associated parameter values, and repeating the sampling and training until optimized parameter values are established.

BRIEF DESCRIPTION OF THE DRAWINGS

These and other features of this invention will be more readily understood from the following detailed description of the various aspects of the invention taken in conjunction with the accompanying drawings in which.

Figure 1:
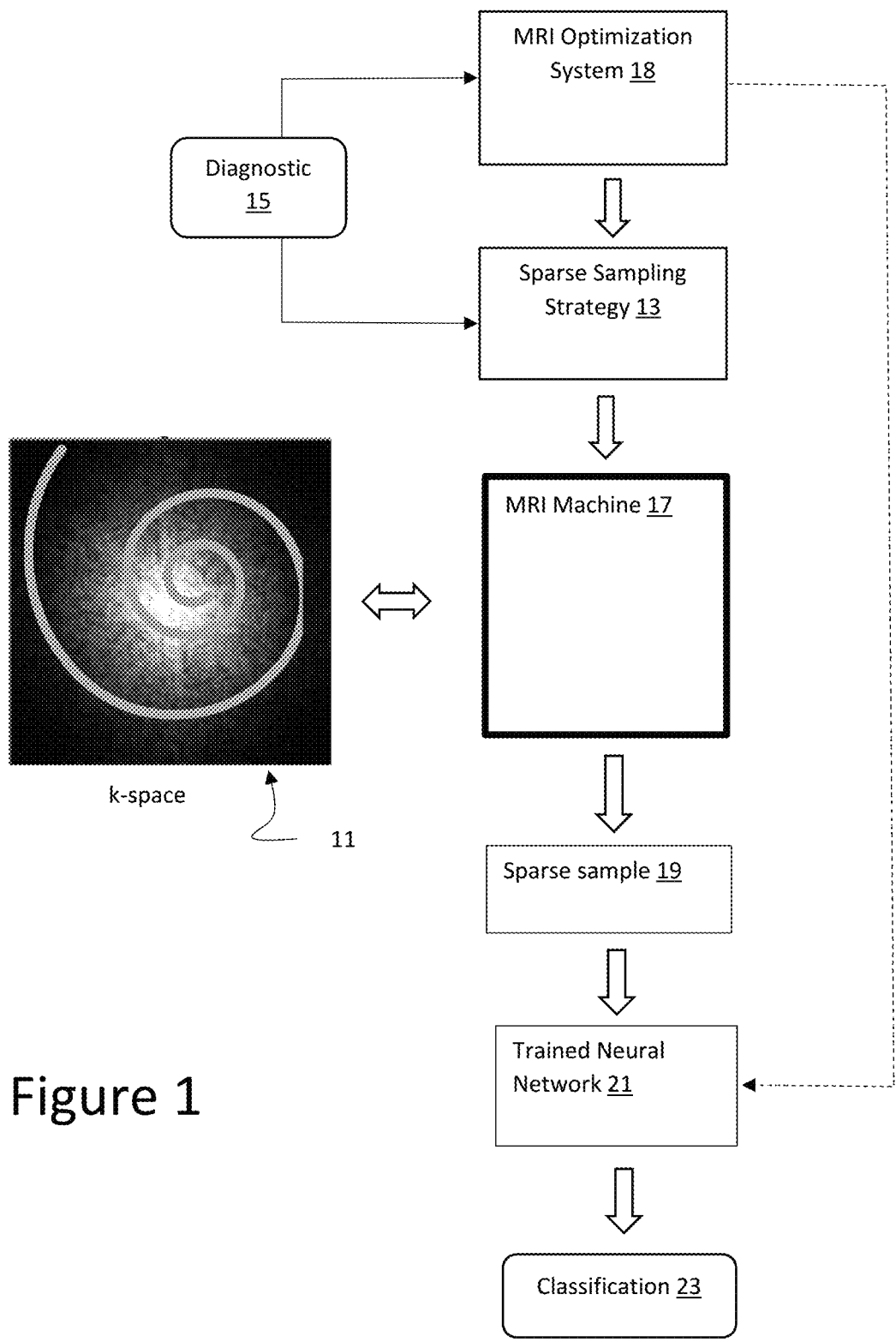
FIG. 1 shows an overview of an MRI process using sparse sampling according to embodiments.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Referring now to the drawings, FIG. 1 depicts an embodiment of an MRI platform that utilizes a sparse sampling strategy. In this approach, an MRI optimization system 18 determines the sparse sampling strategy 13 for acquiring a sparse sample 19 of k-space data 11 for a particular diagnostic assessment ("diagnostic") 15 (e.g., a disease, injury, condition, etc.). For example, to evaluate a condition of osteoporosis, MRI optimization system 18 provides a sparse sampling strategy 13, i.e., a compressed sensing approach, which can be used by an MRI machine 17 during MRI acquisition to obtain the necessary imaging data for evaluating the patient while reducing computational overhead. Using this approach, only a necessary subset of the entire k-space data 11 is captured, e.g., that shown by the spiral. The resulting sparse sample 19 can then be evaluated, e.g., by trained neural network 21 to provide a classification 23, such as a diagnosis, severity, confidence score, etc.

Figure 2:
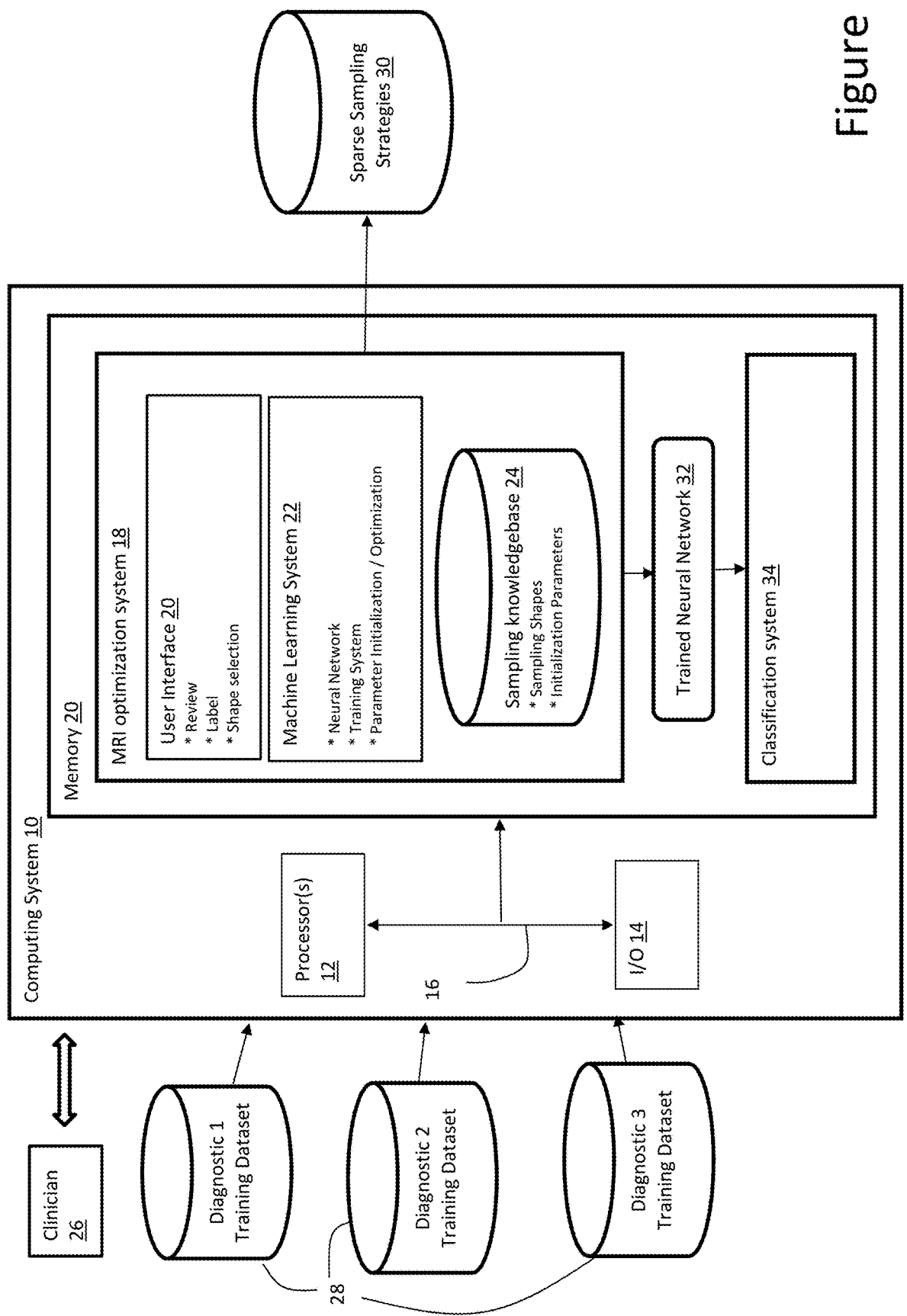
FIG. 2 shows a computing system having an MRI optimization system and classification system according to embodiments.

FIG. 2 depicts a computing system 10 for implementing MRI optimization system 18, which allows a clinician 26 to generate sparse sampling strategies 30 for different diagnostics based on inputted training datasets 28. In this illustrative embodiment, MRI optimization system 18 includes: (1) a user interface 20 for allowing the clinician 26 to review and label training datasets 28 (i.e., label scans with acquisition parameters, diagnosis information such as healthy versus unhealthy, etc.) and assign or select a sampling shape from a sampling knowledgebase 24; and (2) a machine learning system 22 that processes a training dataset 28 to provide a trained neural network 32 and select parameter values for a sparse sampling strategy 30. In one illustrative approach, sampling knowledgebase 24 can include different sampling shapes (e.g., spiral, diamond-like, spherical, linear, radial, etc.) and associated initialization parameters, which the clinician 26 can select or which can be recommended by the MRI optimization system 18. For instance, it may be known or learned that particular sampling shapes are better suited for different types of diagnostic assessments (e.g., soft tissue, bone, tumor, etc.).

Training datasets 28 include raw k-space data scans that, e.g., include both healthy and unhealthy results. The machine learning system 22 operates by implementing an initial sparse sampling strategy that includes a sampling shape (e.g., a spiral) and initial parameter values, and then samples all of the scans with the sparse sampling strategy. The resulting sparse samples are then used to train a neural network 32. For example, sparse samples and their known outcomes (e.g., healthy versus unhealthy) are entered into a neural network and an outcome is calculated. If a healthy input scan results in an unhealthy classification (or vice versa), then the neural network is altered/trained accordingly. After the neural network is fully trained with all of the sparse samples, an accuracy is assigned to the trained neural network/sampling strategy. In one approach, all of the sparse samples can be re-evaluated by the trained neural network to calculate an accuracy. For example, accuracy of a sampling strategy 30 with an associated trained neural network 32 may be defined using a confidence level (e.g., the selected approach will deliver an accurate classification 80% of the time). Note that more complex diagnostic classifications could likewise be evaluated, e.g., rather than a healthy versus unhealthy diagnosis, a classification might involve a diagnosis plus a severity level, e.g., for a torn tendon, classifications may include: no tear, slight tear, major tear, and full tear.

Once the sparse sampling strategy 30 and associated trained neural network 32 has been assigned an accuracy, a new set of parameter values are selected, and the process repeats multiple times to identify optimized parameter values. During each iteration, parameter values can be adjusted based on prior results (e.g., if raising a first parameter value results in worse performance, try lowering the first parameter value, etc.). After multiple iterations, an optimized sparse sample strategy 30 that results in the highest accuracy is obtained for the particular diagnostic.

Also included in computing system 10 is a classification system 34 that is utilized to classify actual patient data obtained from an MRI machine using the optimized sparse sampling strategy 30. As explained herein, the classification system 34 utilizes the trained neural network 32 associated with the optimized sparse sampling strategy 30 to diagnose a sparse scan for the clinician 26.

Figure 3:
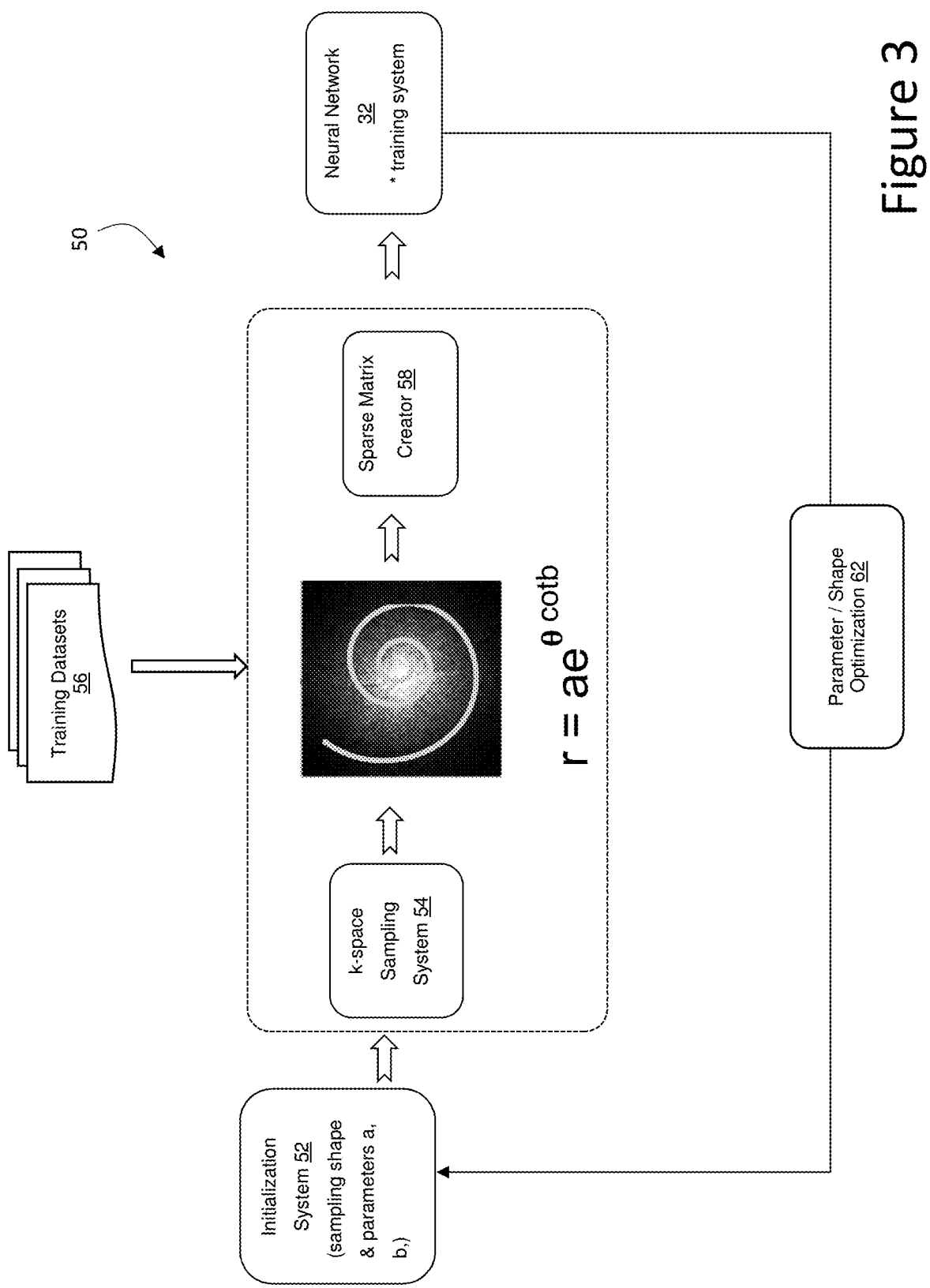
FIG. 3 shows a machine learning system according to embodiments.

FIG. 3 depicts an overview of a machine learning system 50 for determining a sampling strategy 30 for a particular diagnostic. The process begins with an initialization system 52 that selects a sampling strategy that includes a sampling shape and values for the associated parameters. This initialization process may be automated and/or be controlled by a clinician. In this example, a spiral sampling shape is utilized that is defined by the equation $r=ae^{\theta cot b}$, which includes parameters a and b that are initialized by the initialization system 52. A k-space sampling system 54 is then implemented with the sampling strategy and training datasets 56 (i.e., previously collected k-space scans) are sampled with the strategy. In this embodiment, each sparse sample is processed by a sparse matrix creator 58 to generate a sparse matrix, which embodies the data of the sparse scan. Each sparse matrix is then fed into in a neural network 32, which is trained and evaluated for accuracy (e.g., once trained, the neural network is accurate 86% of the time). A parameter/shape optimization system 62 then selects new parameter values for a and b, and the sampling and training processes are repeated multiple times until optimal parameter values are identified that result in the highest accuracy. In the event that a high enough accuracy is not achieved, a new sampling shape may be selected and process is repeated.

Figure 4:
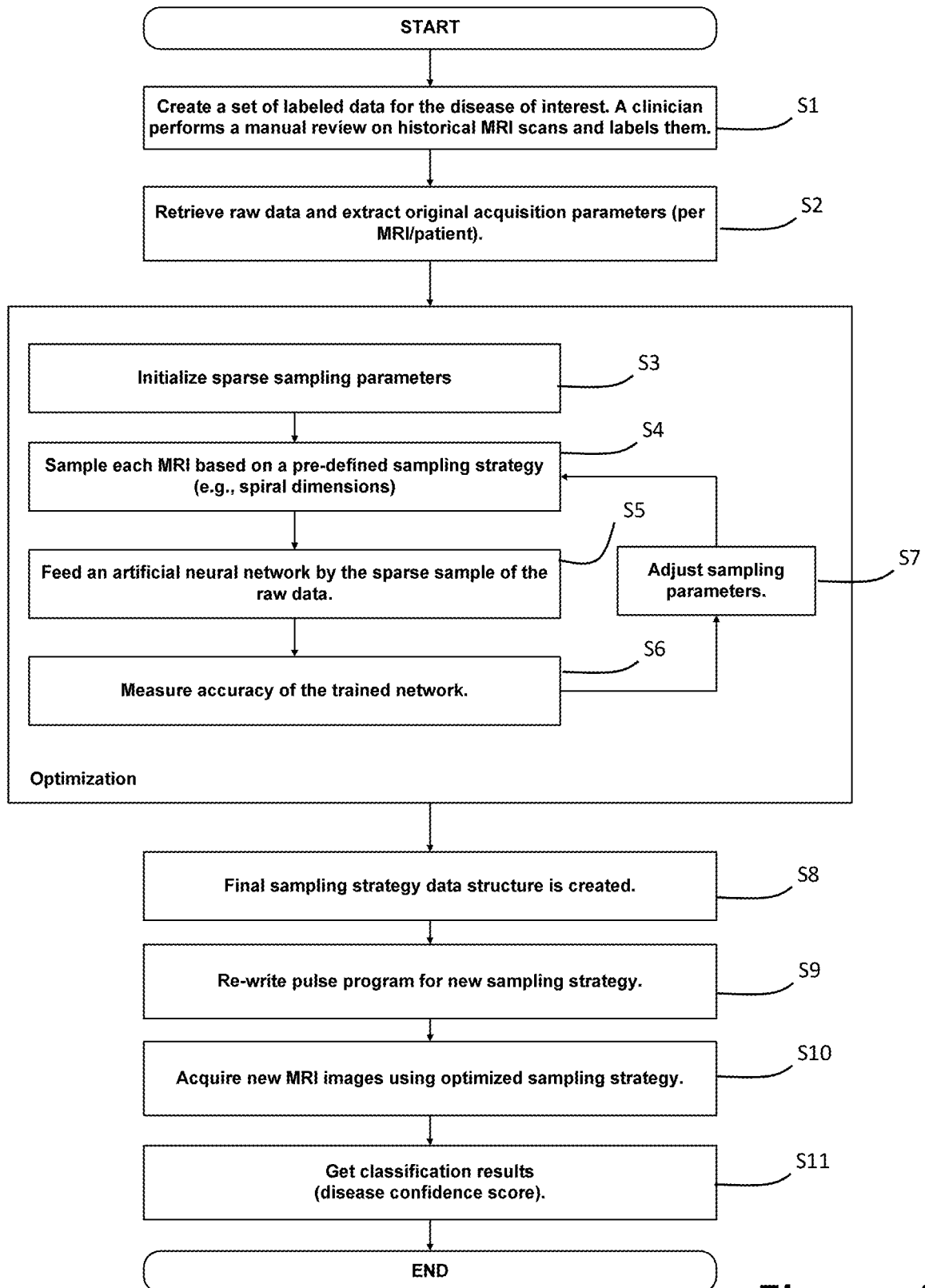
FIG. 4 shows a flow diagram of a complete MRI process using sparse sampling according to embodiments.

FIG. 4 shows a flow diagram of the overall process. At S1, a labeled dataset for a diagnostic (e.g., a disease of interest) is created. This may for example be done by a clinician who performs a manual review of historical MRI scans and labels them accordingly (e.g., healthy versus unhealthy). At S2, the raw k-space data is retrieved along with the original acquisition parameters for each scan in the dataset. The original acquisition parameters are used to write a radiofrequency activation sequence, which is how an MR image is acquired. The acquisition parameters determine the resolution of the final image, as well as other features of the image. The original acquisition parameters can also be used to facilitate the design/selection of the sparse sampling shape (e.g., a spiral).

Once the dataset is ready and a sampling shape is selected, the associated parameter values are initialized at S3, and at S4 each MRI scan in the dataset is sampled based on the sampling strategy to generate a set of sparse samples. At S5, the sparse samples (along with any classification data such as a diagnosis) are fed into a neural network which is trained accordingly and at S6 an accuracy of the trained neural network 32 is measured. At S7, the sampling parameter values are adjusted and the process of sampling and training repeats until an optimized set of parameters are obtained.

At S8, a final sampling strategy data structure is created and at S9 a pulse program is rewritten for the new sampling strategy. The pulse program tells the MRI machine when to apply radiofrequency pulses to create an image of the sample. The set of radio frequency pulse timings and shapes determine the activation of the nuclei in the sample and simultaneously measures the relaxation of the nuclei, which is how an MR image is produced. The pulse program is also what implements the sampling shape (e.g., the spiral).

Once the MRI machine is set up with the new program, it can acquire new MRI images using the optimized sampling strategy at S10 for a patient. At S11, classification results (e.g., healthy versus unhealthy; a confidence score; etc.) are obtained by running the results through the trained neural network that corresponds to the optimized sampling strategy.

Figure 5:
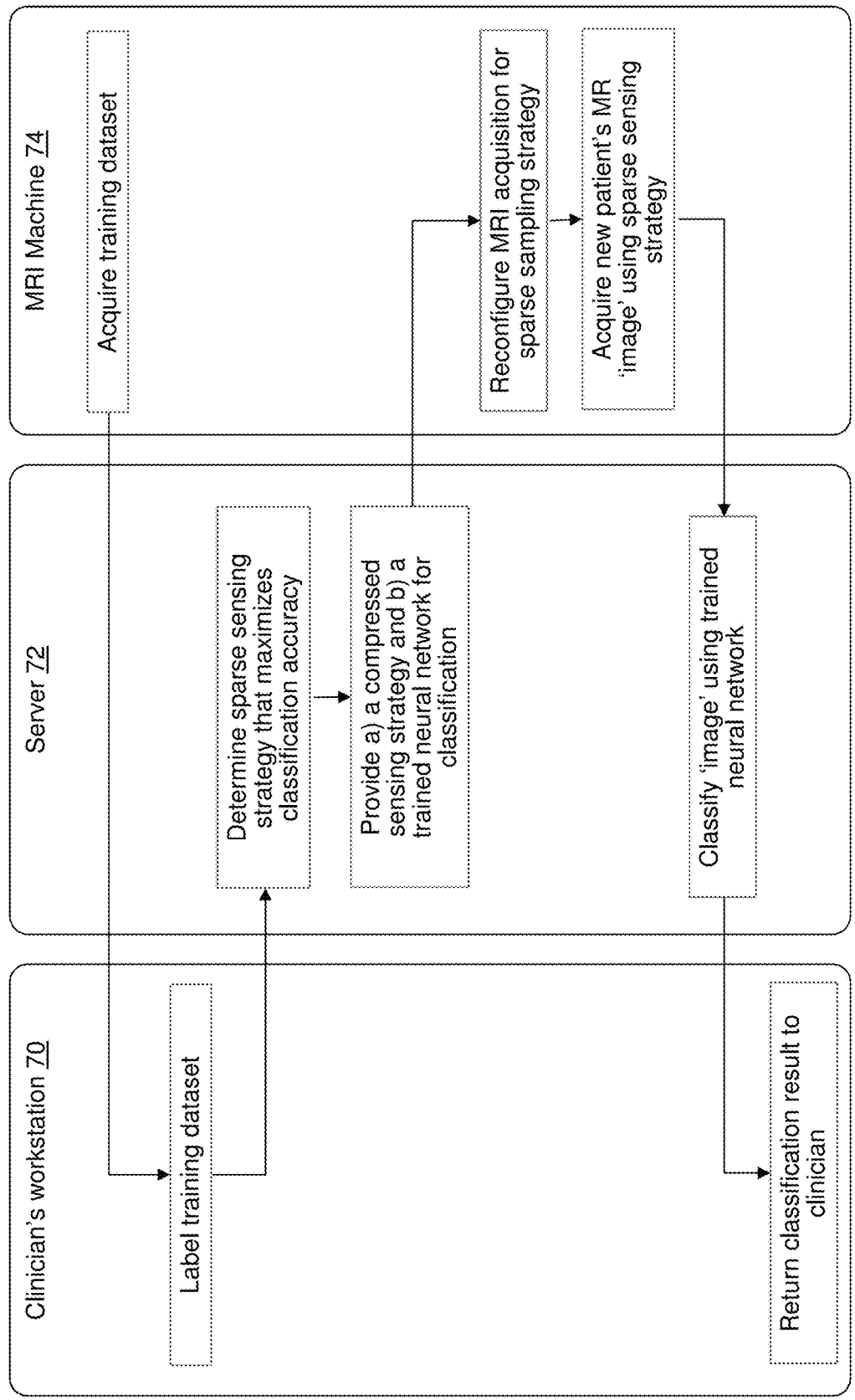
FIG. 5 shows a component level view of an MRI process using sparse sampling according to embodiments.

FIG. 5 depicts an embodiment of the various components and what functions they each provide. In this case, a clinician's workstation 70 is utilized to acquire a training dataset for a particular diagnostic from an MRI machine 74 and label the training dataset. A server 72 (e.g., that implements the machine learning system) can be utilized to determine a sparse sensing strategy and provide a trained neural network. The sparse sensing strategy is then provided to the MRI machine 74 which is reconfigured accordingly. The MRI machine 74 is then used to acquire an actual patient image using the sparse sensing strategy. The results are passed back to the server 72, which uses the trained neural network to classify the image (e.g., healthy versus unhealthy), and returns the results to the clinician's workstation 70.

It is understood that the various aspects, including the MRI optimization system 18 and classification system 34 (FIG. 3) may be implemented as a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Computing system 10 that may comprise any type of computing device and for example includes at least one processor 12, memory 20, an input/output (I/O) 14 (e.g., one or more I/O interfaces and/or devices), and a communications pathway 16. In general, processor(s) 12 execute program code which is at least partially fixed in memory 20. While executing program code, processor(s) 12 can process data, which can result in reading and/or writing transformed data from/to memory and/or I/O 14 for further processing. The pathway 16 provides a communications link between each of the components in computing system 10. I/O 14 can comprise one or more human I/O devices, which enable a user to interact with computing system 10. Computing system 10 may also be implemented in a distributed manner such that different components reside in different physical locations.

Furthermore, it is understood that the systems and/or relevant components thereof (such as an API component, agents, etc.) may also be automatically or semi-automatically deployed into a computer system by sending the components to a central server or a group of central servers. The components are then downloaded into a target computer that will execute the components. The components are then either detached to a directory or loaded into a directory that executes a program that detaches the components into a directory. Another alternative is to send the components directly to a directory on a client computer hard drive. When there are proxy servers, the process will select the proxy server code, determine on which computers to place the proxy servers' code, transmit the proxy server code, then install the proxy server code on the proxy computer. The components will be transmitted to the proxy server and then it will be stored on the proxy server.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method for implementing a sparse sampling strategy for acquiring MRI data, comprising:
    collecting and labeling a training dataset of MRI scans for a predetermined diagnostic;
    selecting a sampling shape and associated parameter values wherein the sampling shape is a diamond-like shape;
    sampling each MM scan in the training data set using the sampling shape and associated parameter values to generate a set of sparse samples;
    training a neural network using the sparse samples and assigning an accuracy to a resulting trained neural network; and
    adjusting the associated parameter values, and repeating the sampling and training until optimized parameter values are established.

2. The method of claim 1, further comprising:
    configuring an MRI machine with a sparse sampling strategy that includes the sampling shape and optimized parameter values.

3. The method of claim 2, further comprising:
    acquiring an MM scan from a patient using the sparse sampling strategy; and
    utilizing the trained neural network to generate a classification of the MM scan.

4. The method of claim 3, wherein the classification provides a diagnosis and a confidence level.

5. The method of claim 4, wherein the trained neural network includes a deep learning model that provides a severity of the diagnosis.

6. The method of claim 1, wherein the training dataset includes raw k-space data and original acquisition parameters.

7. A system for implementing a sparse sampling strategy for acquiring MRI data, comprising:
    a system for collecting and labeling a training dataset of MRI scans for a predetermined diagnostic;
    a system for selecting a sampling shape and associated parameter values wherein the sampling shape is a diamond-like shape;
    a sampling system for sampling each MRI scan in the training data set using the sampling shape and associated parameter values to generate a set of sparse samples;
    a training system for training a neural network using the sparse samples and assigning an accuracy to the neural network; and
    a parameter optimization system that adjusts the associated parameter values and repeatedly runs the sampling system and training system until optimized parameter values are established.

8. The system of claim 7, further comprising:
an MII machine configured with a sparse sampling strategy that includes the sampling shape and optimized parameter values.

9. The system of claim 7, further comprising:
a classification system that utilizes the trained neural network to classify an MII scan obtained from an MM machine configured with a sparse sampling strategy that includes the sampling shape and optimized parameter values.

10. The system of claim 9, wherein the classification system provides a diagnosis and a confidence level.

11. The system of claim 10, wherein the trained neural network includes a deep learning model that provides a severity of the diagnosis.

12. The system of claim 7, wherein the training dataset includes raw k-space data and original acquisition parameters.

13. A computer program product stored on a non-transitory computer readable storage medium, which when executed by a computing system, provides a sparse sampling strategy for acquiring MRI data, the program product comprising:
program code that collects labels a training dataset of MRI scans for a predetermined diagnostic;
program code for selecting a sampling shape and associated parameter values wherein the sampling shape is a diamond-like shape;
program code for sampling each MRI scan in the training data set using the sampling shape and associated parameter values to generate a set of sparse samples;
program code for training a neural network using the sparse samples and assigning an accuracy to a resulting trained neural network; and
program code for adjusting the associated parameter values, and repeating the sampling and training until optimized parameter values are established.

14. The program product of claim 13, further comprising:
program code for inputting an acquired MRI scan from a patient using the sparse sampling strategy; and
program code for utilizing the trained neural network to generate a classification of the MRI scan.

15. The program product of claim 14, wherein the classification provides a diagnosis and a confidence level.

16. The program product of claim 13, wherein the trained neural network includes a deep learning model that provides a severity of the diagnosis.

17. The program product of claim 13, wherein the training dataset includes raw k-space data and original acquisition parameters.

\* \* \* \* \*